United States Patent
Koike et al.

(10) Patent No.: US 8,629,226 B2
(45) Date of Patent: Jan. 14, 2014

(54) RETARDATION FILM, AND ORGANIC EL DISPLAY DEVICE AND LIQUID CRYSTAL DISPLAY DEVICE USING THE SAME

(75) Inventors: Takeshi Koike, Yokohama (JP); Shinichi Komatsu, Yokohama (JP); Tetsuya Uesaka, Tokyo (JP); Hisashi Sone, Yokohama (JP); Yuji Takahashi, Yokohama (JP)

(73) Assignee: JX Nippon Oil & Energy Corporation, Tokyo (JP)

( * ) Notice: Subject to any disclaimer, the term of this patent is extended or adjusted under 35 U.S.C. 154(b) by 0 days.

(21) Appl. No.: 13/519,770

(22) PCT Filed: Dec. 24, 2010

(86) PCT No.: PCT/JP2010/073387
§ 371 (c)(1),
(2), (4) Date: Jun. 28, 2012

(87) PCT Pub. No.: WO2011/081101
PCT Pub. Date: Jul. 7, 2011

(65) Prior Publication Data
US 2012/0302713 A1    Nov. 29, 2012

(30) Foreign Application Priority Data

Dec. 28, 2009    (JP) ................. 2009-296927

(51) Int. Cl.
*C08G 61/06* (2006.01)
*C09K 19/00* (2006.01)
*C08F 8/04* (2006.01)

(52) U.S. Cl.
USPC ........ 526/259; 526/268; 526/281; 525/326.7; 525/327.2; 525/333.3; 428/1.1; 349/117

(58) Field of Classification Search
USPC ............... 526/281, 282, 259, 268; 428/1.1; 349/117; 525/326.7, 327.2, 333.3
See application file for complete search history.

(56) References Cited

U.S. PATENT DOCUMENTS 7,867,581 B2    1/2011    Komatsu et al.
2009/0156770 A1    6/2009    Komatsu et al.

FOREIGN PATENT DOCUMENTS

| | | | |
|---|---|---|---|
| JP | 2005-290048 | A | 10/2005 |
| JP | 2006-189474 | A | 7/2006 |
| JP | 2007-197624 | A | 8/2007 |
| JP | 2007-224145 | A | 9/2007 |
| JP | 2008-007733 | A | 1/2008 |
| JP | 2008-052119 | A | 3/2008 |
| JP | 2008-222663 | A | 9/2008 |

OTHER PUBLICATIONS

Machine translation of JP 2008-222663 A, published Sep. 2008.*
Machine translation of JP 2007-224145 A, published Jun. 2007.*
International Search Report dated Mar. 22, 2011, corresponding with International Application PCT/JP2010/073387.
International Preliminary Examination Report mailed Aug. 23, 2012, corresponding with International Application PCT/JP2010/073387.

* cited by examiner

*Primary Examiner* — Fred M Teskin
(74) *Attorney, Agent, or Firm* — Fitch, Even, Tabin & Flannery LLP

(57) ABSTRACT

A retardation film, formed by stretching a film having a norbornene-based ring-opening copolymer containing a structural unit (A) represented by the general formula (1) and a structural unit (B) represented by the general formula (2), wherein the content of structural unity (A) is not less than 5 mol % but not more than 95 mol % relative to the total amount of structural units (A) and (B).

6 Claims, 1 Drawing Sheet

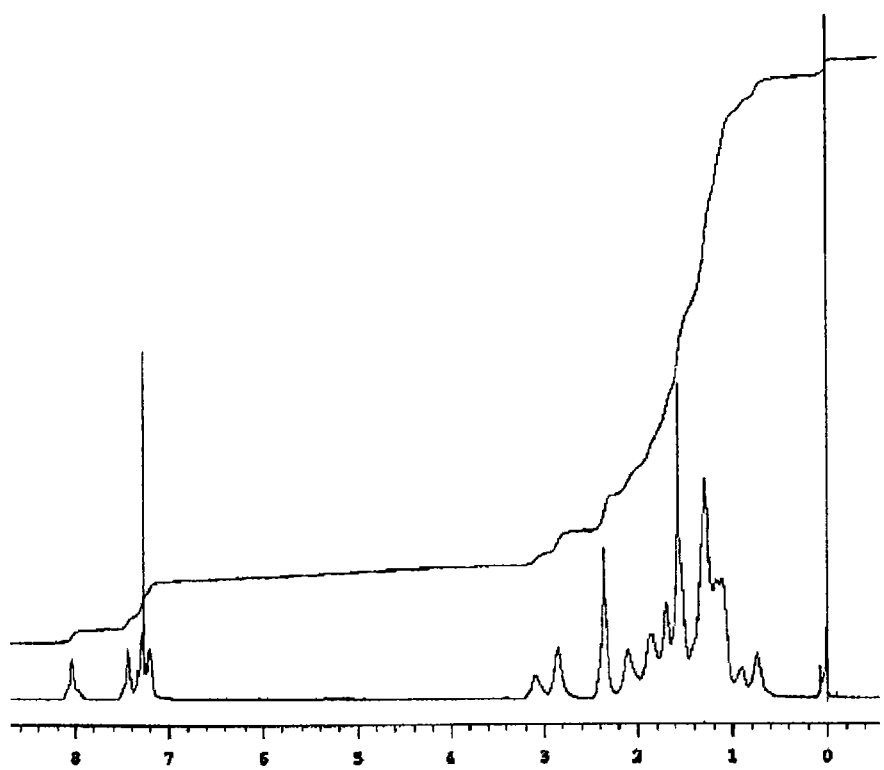

RETARDATION FILM, AND ORGANIC EL DISPLAY DEVICE AND LIQUID CRYSTAL DISPLAY DEVICE USING THE SAME

CROSS-REFERENCE TO RELATED APPLICATIONS

This Application is a U.S. National Stage Application filed under 35 U.S.C. §371 of International Application PCT/JP2010/073387, filed Dec. 24, 2010, designating the United States, which claims priority from Japanese Patent Application 2009-296927, filed Dec. 28, 2009, the complete disclosures of which are hereby incorporated herein by reference in their entirety for all purposes.

TECHNICAL FIELD

The present invention relates to a retardation film, and to an organic EL display device and a liquid crystal display device using the retardation film. More specifically, the present invention relates to a retardation film which is suitably applicable to a ½λ plate, a ¼λ plate, a protection film, an antireflection film, and the like, and to an organic EL display device and a liquid crystal display device using the retardation film.

BACKGROUND ART

In organic EL (electro luminescence) display devices such as organic EL displays and in liquid crystal display devices such as liquid crystal displays (LCDs), a retardation film having a controlled optical anisotropy is used for the purpose of optical compensation, and materials such as polycarbonates and cyclic polyolefins have been mainly used for the retardation film. In recent years, of these cyclic polyolefins, norbornene-based ring-opening copolymers using highly reactive norbornene derivatives as precursors have attracted attention, and retardation films have been developed which utilize various kinds of norbornene-based ring-opening copolymers.

For example, Japanese Unexamined Patent Application Publication No. 2008-52119 (PTL 1) discloses a reverse dispersion retardation film containing a norbornene-based ring-opening polymer obtained from a specific norbornene derivative with a controlled endo/exo ratio. However, the reverse dispersion retardation film made of the conventional norbornene-based ring-opening polymer described in PTL 1 is not necessarily sufficient in terms of heat resistance. In addition, Japanese Unexamined Patent Application Publication No. 2005-290048 (PTL 2) and Japanese Unexamined Patent Application Publication No. 2008-7733 (PTL 3) disclose norbornene-based ring-opening copolymers obtained by using norbornene derivatives having specific spiro rings. However, when films are formed by using the conventional norbornene-based ring-opening copolymers described in PTLs 2 and 3, retardation films having optical characteristics such as reverse dispersion characteristics or negative A characteristics cannot necessarily be obtained. Note that, when a film which does not have reverse dispersion characteristics but has low-birefringence characteristics is used for a retardation film, the thickness of the film needs to be sufficiently large. For this reason, the conventional norbornene-based ring-opening copolymers described in PTLs 2 and 3 are not necessarily sufficient also in terms of costs for film production and of thin film formation. Accordingly, the retardation films utilizing the conventional norbornene-based ring-opening copolymers are still insufficient in terms of achievement of both heat resistance and optical characteristics.

CITATION LIST

Patent Literature

[PTL 1] Japanese Unexamined Patent Application Publication No. 2008-52119
[PTL 2] Japanese Unexamined Patent Application Publication No. 2005-290048
[PTL 3] Japanese Unexamined Patent Application Publication No. 2008-7733

SUMMARY OF INVENTION

Technical Problem

The present invention has been made in view of the above-described problems of the conventional techniques. An object of the present invention is to provide a retardation film being capable of providing a reverse dispersion of birefringence wavelength dispersion characteristics, also of attaining optical characteristics as a negative A which are unique even among negative birefringence characteristics, and of exhibiting excellent optical characteristics and a high level of heat resistance, as well as to provide an organic EL display device and a liquid crystal display device using the retardation film.

Solution to Problem

The present inventors have earnestly studied in order to achieve the above object. As a result, the inventors have found that a retardation film being capable of providing a reverse dispersion of birefringence wavelength dispersion characteristics, also of attaining optical characteristics as a negative A which are unique even among negative birefringence characteristics, and of exhibiting excellent optical characteristics and a high level of heat resistance can be obtained by stretching a film comprising a norbornene-based ring-opening copolymer containing a structural unit (A) represented by the following general formula (1) and a structural unit (B) represented by the following general formula (2), wherein a content of the structural unit (A) is not less than 5 mol % but not more than 95 mol % relative to a total amount of the structural units (A) and (B). This finding has led to the completion of the present invention.

Specifically, a retardation film of the present invention is formed by stretching a film comprising a norbornene-based ring-opening copolymer containing a structural unit (A) represented by the following general formula (1):

[Chem. 1]

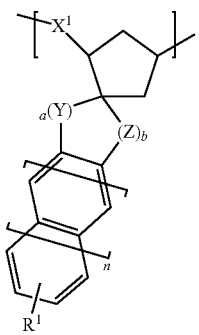

(1)

[in the formula (1), n represents an integer of any one of 0 and 1, $R^1$ represents an atom or a group selected from the group consisting of a hydrogen atom; halogen atoms; substituted or unsubstituted hydrocarbon groups, each of which may have at least one linking group selected from the group consisting of an oxygen atom, a nitrogen atom, a sulfur atom, and a silicon atom, and which has 1 to 30 carbon atoms; and polar groups, $X^1$ represents a group selected from the group consisting of a group represented by a formula: —CH=CH— and a group represented by a formula: —CH$_2$CH$_2$—, a and b each independently represent an integer of 0 to 6, each Y, which may be the same or different when provided in plurality in a single structural unit, represents a group selected from the group consisting of a methylene group, a carbonyl group, an oxy group, and alkylimino groups having 1 to 5 carbon atoms, and each Z, which may be the same or different when provided in plurality in a single structural unit, represents a group selected from the group consisting of a methylene group, a carbonyl group, an oxy group, and alkylimino groups having 1 to 5 carbon atoms], and a structural unit (B) represented by the following general formula (2):

[Chem. 2]

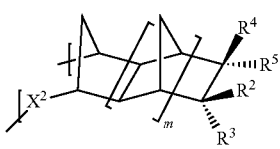

(2)

[in the formula (2), m represents an integer of any one of 0 and 1, $X^2$ represents a group selected from the group consisting of a group represented by a formula: —CH=CH— and a group represented by a formula: —CH$_2$CH$_2$—, $R^2$, $R^3$, $R^4$, and $R^5$, which may be the same or different, each represent an atom or a group selected from the group consisting of a hydrogen atom, halogen atoms, a cyano group, alkyl groups having 1 to 20 carbon atoms, alkenyl groups having 1 to 20 carbon atoms, alkylcarbonyl groups having 1 to 20 carbon atoms, and ester groups having a hydrocarbon group having 1 to 20 carbon atoms, two or more of $R^2$ to $R^5$ may be bonded to each other to form a monocyclic hydrocarbon which has 3 to 20 carbon atoms, which is not a spiro ring, and which may have an unsaturated bond, or a polycyclic hydrocarbon which has 4 to 20 carbon atoms, which is not a spiro ring, and which may have an unsaturated bond, and $R^2$ and $R^3$, or $R^4$ and $R^5$ may together form an alkylidene group having 1 to 20 carbon atoms], wherein a content of the structural unit (A) is not less than 5 mol % but not more than 95 mol % relative to a total amount of the structural units (A) and (B).

In the retardation film of the present invention, n in the general formula (1) is preferably 0, and $R^1$ in the general formula (1) is preferably a hydrogen atom.

In addition, the retardation film of the present invention can have reverse dispersion optical characteristics. The retardation film of the present invention is preferably such that the content of the structural unit (A) is not less than 20 mol % but not more than 50 mol % relative to the total amount of the structural units (A) and (B), and the retardation film is a reverse dispersion retardation film.

In addition, the retardation film of the present invention can have negative A optical characteristics. The retardation film of the present invention is preferably such that the content of the structural unit (A) is more than 50 mol % but not more than 95 mol % relative to the total amount of the structural units (A) and (B), and the retardation film is a negative A retardation film.

Moreover, the retardation film of the present invention is preferably such that a total amount of a structural unit in which $X^1$ is the group represented by the formula: —CH$_2$CH$_2$— among the structural units (A) and a structural unit in which $X^2$ is the group represented by the formula: —CH$_2$CH$_2$— among the structural units (B) is 90 mol % or more relative to the total amount of the structural units (A) and (B) in the norbornene-based ring-opening copolymer.

In addition, the retardation film of the present invention is preferably such that the norbornene-based ring-opening copolymer has a weight average molecular weight of 10000 to 1000000 in terms of polystyrene, and a molecular weight distribution of 1.0 to 10.

An organic EL display device of the present invention comprises the retardation film of the present invention.

A liquid crystal display device of the present invention comprises the retardation film of the present invention.

Advantageous Effects of Invention

According to the present invention, it is possible to provide a retardation film capable of providing a reverse dispersion of birefringence wavelength dispersion characteristics, also of attaining optical characteristics as a negative A which are unique even among negative birefringence characteristics, and of exhibiting excellent optical characteristics and a high level of heat resistance, as well as to provide an organic EL display device and a liquid crystal display device using the retardation film.

BRIEF DESCRIPTION OF DRAWINGS

The FIGURE is a graph showing an NMR chart of a hydrogenated product of a ring-opening copolymer of dicyclopentadiene/spiro[3,4-dihydronaphthalen-1-one-2,5'-2'-norbornene].

DESCRIPTION OF EMBODIMENTS

Hereinafter, the present invention will be described in detail based on preferred embodiments thereof.

First, a retardation film of the present invention is described. Specifically, the retardation film of the present invention is formed by stretching a film comprising a norbornene-based ring-opening copolymer containing a structural unit (A) represented by the following general formula (1):

[Chem. 3]

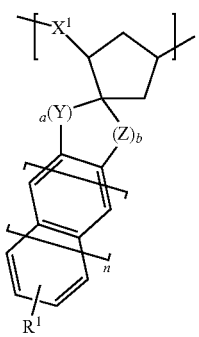
(1)

[in the formula (1), n represents an integer of any one of 0 and 1, $R^1$ represents an atom or a group selected from the group consisting of a hydrogen atom; halogen atoms; substituted or unsubstituted hydrocarbon groups, each of which may have at least one linking group selected from the group consisting of an oxygen atom, a nitrogen atom, a sulfur atom, and a silicon atom, and which has 1 to 30 carbon atoms; and polar groups, $X^1$ represents a group selected from the group consisting of a group represented by a formula: —CH=CH— and a group represented by a formula: —CH$_2$CH$_2$—, a and b each independently represent an integer of 0 to 6, each Y, which may be the same or different when provided in plurality in a single structural unit, represents a group selected from the group consisting of a methylene group, a carbonyl group, an oxy group, and alkylimino groups having 1 to 5 carbon atoms, and each Z, which may be the same or different when provided in plurality in a single structural unit, represents a group selected from the group consisting of a methylene group, a carbonyl group, an oxy group, and alkylimino groups having 1 to 5 carbon atoms], and a structural unit (B) represented by the following general formula (2):

[Chem. 4]

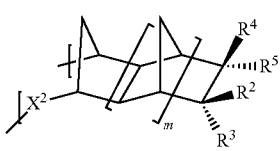
(2)

[in the formula (2), m represents an integer of any one of 0 and 1, $X^2$ represents a group selected from the group consisting of a group represented by a formula: —CH=CH— and a group represented by a formula: —CH$_2$CH$_2$—, $R^2$, $R^3$, $R^4$, and $R^5$, which may be the same or different, each represent an atom or a group selected from the group consisting of a hydrogen atom, halogen atoms, a cyano group, alkyl groups having 1 to 20 carbon atoms, alkenyl groups having 1 to 20 carbon atoms, alkylcarbonyl groups having 1 to 20 carbon atoms, and ester groups having a hydrocarbon group having 1 to 20 carbon atoms, two or more of $R^2$ to $R^5$ may be bonded to each other to form a monocyclic hydrocarbon which has 3 to 20 carbon atoms, which is not a spiro ring, and which may have an unsaturated bond, or a polycyclic hydrocarbon which has 4 to 20 carbon atoms, which is not a spiro ring, and which may have an unsaturated bond, and $R^2$ and $R^3$, or $R^4$ and $R^5$ may together form an alkylidene group having 1 to 20 carbon atoms], wherein a content of the structural unit (A) is not less than 5 mol % but not more than 95 mol % relative to a total amount of the structural units (A) and (B).

As described above, the norbornene-based ring-opening copolymer according to the present invention contains the structural unit (A) represented by the general formula (1) and the structural unit (B) represented by the general formula (2).

The structural unit (A) each has a spiro skeleton as represented by the general formula (1). Moreover, in the structural unit (A), a cyclopentane ring obtained by ring-opening polymerization of a norbornene monomer, and a cyclic compound containing (Y)a, (Z)b, and an aromatic ring are linked with each other through a spiroatom. In addition, in the structural unit (A), n in the general formula (1) represents an integer of any one of 0 and 1. In other words, as the structural unit (A), a single kind of a structural unit in which the value of n is any one of 0 and 1 may be contained in the norbornene-based ring-opening copolymer. Alternatively, a structural unit in which the value of n is 0 and a structural unit in which the value of n is 1 may be coexistent therein. The value of n can be adjusted as appropriate according to an intended design in order to control various properties such as optical characteristics, heat resistance, and film processability in a balanced manner. From the viewpoint of easiness of synthesizing the norbornene monomer, the value is preferably 0.

In the general formula (1), Y is at least one group selected from the group consisting of a methylene group (—CH$_2$—), a carbonyl group (>CO), an oxy group (—O—), and alkylimino groups having 1 to 5 carbon atoms (>NR [R represents an alkyl group having 1 to 5 carbon atoms]). Meanwhile, in the general formula (1), Z is at least one group selected from the group consisting of a methylene group (—CH$_2$—), a carbonyl group (>CO), an oxy group (—O—), and alkylimino groups having 1 to 5 carbon atoms (>NR [R represents an alkyl group having 1 to 5 carbon atoms]). A methylene group, a carbonyl group, or an oxy group is preferable as Y or Z, from the viewpoints of availability of the raw material monomer and easiness of synthesis thereof. Among these, a methylene group or a carbonyl group is more preferable.

Moreover, a representing the number of Ys is an integer of 0 to 6 (more preferably 1 to 5). Further, b representing the number of Zs is an integer of 0 to 6 (more preferably 1 to 5). Accordingly, each of Y and Z may be provided in plurality in the structural unit (A). When Y is provided in plurality in a single structural unit represented by the general formula (1) in this manner, in other words, when a is 2 or larger, Ys provided in the single structural unit may be the same or different. Additionally, when Z is provided in plurality in a single structural unit represented by the general formula (1), in other words, when b is 2 or larger, Zs provided in a single structural unit may be the same or different. Furthermore, a group comprising such a plurality of Ys or a group comprising such a plurality of Zs is preferably a group including a methylene group and at least one selected from the group consisting of a carbonyl group and an oxy group, and is more preferably a group including a methylene group and one carbonyl group and/or one oxy group.

Moreover, in the general formula (1), $X^1$ is a group represented by a formula: —CH=CH— or a group represented by a formula: —CH$_2$CH$_2$—. Further, the structural unit (A) may comprise a single kind of a structural unit in which $X^1$ is only one of the above-described groups. Alternatively, a structural unit in which $X^1$ is a group represented by a formula: —CH=CH— and a structural unit in which $X^1$ is a group represented by a formula: —CH$_2$CH$_2$— may coexist as the structural unit (A).

Furthermore, in the general formula (1), $R^1$ is an atom or a group selected from the group consisting of a hydrogen atom; halogen atoms; substituted or unsubstituted hydrocarbon groups, each of which may have at least one linking group selected from the group consisting of an oxygen atom, a nitrogen atom, a sulfur atom, and a silicon atom, and which has 1 to 30 (more preferably 1 to 10, and further preferably 1 to 6) carbon atoms; and polar groups. Examples of the polar groups include a hydroxyl group, a mercapto group, a cyano group, an amino group, a carboxyl group, a sulfonic group, and the like. Further, the substituent represented by $R^1$ in the general formula (1) is preferably a hydrogen atom or an alkyl group having 1 to 6 carbon atoms, and particularly preferably a hydrogen atom from the viewpoint of availability of the raw material monomer. Note that, one kind of the structural units (A) alone or a combination of two or more kinds thereof may be contained as the structural unit (A) in the norbornene-based ring-opening copolymer.

In addition, the structural unit (A) is particularly preferably such that, in the general formula (1), n is 0, and $R^1$ is a hydrogen atom, from the viewpoints of easiness of monomer production and availability of the monomer, and the like.

Meanwhile, the structural unit (B) is a structural unit represented by the general formula (2). In the general formula (2), m represents an integer of any one of 0 and 1. In other words, as the structural unit (B), a single kind of a structural unit in which the value of m is any one of 0 and 1 may be contained in the norbornene-based ring-opening copolymer. Alternatively, a structural unit in which the value of m is 0 and a structural unit in which the value of m is 1 may be coexistent therein. The value of m can be adjusted as appropriate according to an intended design in order to control various properties such as optical characteristics, heat resistance, and film processability in a balanced manner. From the viewpoint of easiness of synthesizing the norbornene monomer, the value is preferably 0. In addition, $X^2$ in the general formula (2) is synonymous with $X^1$ in the general formula (1).

In the general formula (2), the substituents represented by $R^2$, $R^3$, $R^4$, and $R^5$ may be the same or different, and are each any one atom or group selected from a hydrogen atom, halogen atoms, a cyano group, alkyl groups having 1 to 20 carbon atoms, alkenyl groups having 1 to 20 carbon atoms, alkylcarbonyl groups having 1 to 20 carbon atoms, and ester groups having a hydrocarbon group having 1 to 20 carbon atoms. Note that two or more of $R^2$ to $R^5$ may be bonded to each other to form a monocyclic hydrocarbon which has 3 to 20 carbon atoms, which is not a Spiro ring, and which may have an unsaturated bond, or a polycyclic hydrocarbon which has 4 to 20 carbon atoms, which is not a Spiro ring, and which may have an unsaturated bond; and $R^2$ and $R^3$ may together form an alkylidene group having 1 to 20 carbon atoms, or $R^4$ and $R^5$ may together form an alkylidene group having 1 to 20 carbon atoms.

The alkyl group having 1 to 20 (more preferably 1 to 10) carbon atoms may be linear, branched, or cyclic, and is not particularly limited. From the viewpoints of transparency and weather resistance, a methyl group, an ethyl group, and the like are preferable. In addition, if the number of carbon atoms of the alkyl group exceeds the upper limit, purification by methods, such as distillation and recrystallization, is difficult.

In addition, the alkenyl group having 1 to 20 (more preferably 1 to 10) carbon atoms may be linear, branched, or cyclic, and is not particularly limited. From the viewpoints of transparency and weather resistance, an ethylidene group and the like are preferable. In addition, if the number of carbon atoms of the alkenyl group exceeds the upper limit, purification by methods, such as distillation and recrystallization, is difficult.

In addition, the alkylcarbonyl group having 1 to 20 (more preferably 1 to 10) carbon atoms may be linear, branched, or cyclic, and is not particularly limited. From the viewpoints of transparency and weather resistance, a methyl carbonyl group, an ethyl carbonyl group, and the like are preferable. In addition, if the number of carbon atoms of the alkylcarbonyl group exceeds the upper limit, purification by methods, such as distillation and recrystallization, is difficult.

Furthermore, the ester group having a hydrocarbon group having 1 to 20 (more preferably 1 to 10) carbon atoms may be linear, branched, or cyclic, and is not particularly limited. From the viewpoints of transparency and weather resistance, a methoxycarbonyl group, an ethoxycarbonyl group, and the like are preferable. Note that, if the number of carbon atoms of the ester exceeds the upper limit, purification by methods, such as distillation and recrystallization, is difficult.

In addition, the monocyclic hydrocarbon which has 3 to 20 (more preferably 3 to 10) carbon atoms, which is not a spiro ring, and which may have an unsaturated bond is not particularly limited, and may further have another substituent. From the viewpoints of transparency and weather resistance, the monocyclic hydrocarbon is preferably cyclopentene, cyclohexene, or the like. In addition, if the number of carbon atoms of the monocyclic hydrocarbon exceeds the upper limit, purification by methods, such as distillation and recrystallization, is difficult.

In addition, the polycyclic hydrocarbon which has 4 to 20 (more preferably 4 to 12) carbon atoms, which is not a spiro ring, and which may have an unsaturated bond is not particularly limited, and may further have another substituent. From the viewpoints of transparency and weather resistance, the polycyclic hydrocarbon is preferably naphthalene, biphenyl, or the like. In addition, if the number of carbon atoms of the polycyclic hydrocarbon exceeds the upper limit, purification by methods, such as distillation and recrystallization, is difficult.

Further, the alkylidene group having 1 to 20 (more preferably 1 to 10) carbon atoms is not particularly limited. From the viewpoints of transparency and weather resistance, indane, tetralin, and the like are preferable. In addition, if the number of carbon atoms of the alkylidene group exceeds the upper limit, purification by methods, such as distillation and recrystallization, is difficult.

In addition, in the norbornene-based ring-opening copolymer, a content of the structural unit (A) is not less than 5 mol % but not more than 95 mol % relative to a total amount of the structural units (A) and (B). In other words, in the norbornene-based ring-opening copolymer, a molar ratio between the structural unit (A) and the structural unit (B) ([structural unit (A)]:[structural unit (B)]) is 5:95 to 95:5. If the content of the structural units (A) is less than the lower limit, it is not possible to obtain a retardation film having unique optical characteristics such as reverse dispersion characteristics or negative A characteristics and a high level of heat resistance in a balanced manner. Meanwhile, if the content of the structural unit (A) exceeds the upper limit, the film processability tends to be lowered.

In addition, in the norbornene-based ring-opening copolymer, the content of the structural unit (A) is preferably not less than 20 mol % but not more than 50 mol % (and more preferably not less than 30 mol % but not more than 50 mol %) relative to the total amount of the structural units (A) and (B), from the viewpoint of providing reverse dispersion optical characteristics to the retardation film of the present invention. In other words, from the viewpoint of obtaining a reverse dispersion retardation film, the molar ratio between the structural unit (A) and the structural unit (B) ([structural unit (A)]:[structural unit (B)]) is preferably 20:80 to 50:50 (more preferably 30:70 to 50:50). If the content of the structural unit (A) is less than the lower limit, the heat resistance of the obtained retardation film tends to be lowered. Meanwhile, if the content of the structural units (A) exceeds the upper limit, there is a tendency that the retardation film exhibits normal wavelength dispersion, so that a retardation film having reverse dispersion optical characteristics cannot be obtained.

Moreover, in the norbornene-based ring-opening copolymer, the content of the structural unit (A) is preferably more than 50 mol % but not more than 95 mol % (more preferably not less than 60 mol % but not more than 95 mol %) relative to the total amount of the structural units (A) and (B), from the viewpoint of providing so-called negative A optical characteristics to the retardation film of the present invention. In other words, from the viewpoint of obtaining a negative A retardation film, the molar ratio between the structural unit (A) and the structural unit (B) ([structural unit (A)]:[structural unit (B)]) is preferably more than 50:less than 50 to 95:5 (more preferably 60:40 to 95:5). If the content of the structural unit (A) is less than the lower limit, optical characteristics as a negative A which are unique even among negative birefringence characteristics tends not to be attained. Meanwhile, if the content of the structural unit (A) exceeds the upper limit, the film processability tends to be lowered. Here, the retardation film having negative A characteristics is preferably such that, when a stretching direction in uniaxial stretching of the film is defined as X-axis, and directions perpendicular to the X-axis are defined as Y-axis and Z-axis, respectively, an X-axis refractive index (Nx), a Y-axis refractive index (Ny), and a Z-axis refractive index (Nz) satisfy a relationship represented by the following inequality (1):

$$Ny=Nz>Nx \qquad (1).$$

Here, as a method for measuring the refractive indexes (Nx, Ny, and Nz), a method for measuring the refractive indexes by using a polarization and retardation measuring apparatus (manufactured by AXOMETRICS, Inc., product name: AxoScan), or a method for measuring the refractive indexes by using a refractive index measuring apparatus manufactured by Metricon Corp. under the product name of "2010 Prism Coupler" can be employed, for example.

In addition, the norbornene-based ring-opening copolymer may contain structural units (for example, structural units derived from a molecular weight controlling agent to be described later or the like) other than the structural units (A) and (B), as long as the effects of the present invention are not impaired. Note that, in the norbornene-based ring-opening copolymer according to the present invention, a total amount of the structural unit (A) and the structural unit (B) is preferably 70 to 100 mol %, more preferably 90 to 100 mol %, and particularly preferably 100 mol %, relative to all structural units.

Moreover, as the percentage of hydrogenation on the main chain rises, in other words, as the number of double bonds in the main chain decreases, the norbornene-based ring-opening copolymer becomes more stable. Accordingly, as the norbornene-based ring-opening copolymer according to the present invention, a polymer which is sufficiently hydrogenated, and which has a smaller number of double bonds in the main chain is preferable. From such a viewpoint, a total amount of a structural unit in which $X^1$ is the group represented by the formula: $-CH_2CH_2-$ among the structural units (A) and a structural unit in which $X^2$ is the group represented by the formula: $-CH_2CH_2-$ among the structural units (B) is preferably 90 mol % or more (more preferably 95 mol % or more, and particularly preferably 98 mol % or more) relative to the total amount of the structural units (A) and (B) in the norbornene-based ring-opening copolymer. If the ratio is less than 90 mol %, the stability of the polymer is lowered, and it tends to be difficult to suppress coloring and deterioration due to heat.

In addition, a weight average molecular weight (Mw) of the norbornene-based ring-opening copolymer according to the present invention is preferably 10000 to 1000000, and more preferably 20000 to 300000. If the weight average molecular weight of the norbornene-based ring-opening copolymer is less than the lower limit, the strength of the obtained norbornene-based ring-opening copolymer tends to be low. Meanwhile, if the weight average molecular weight exceeds the upper limit, the melt viscosity of the obtained norbornene-based ring-opening copolymer tends to be too high.

In addition, a number average molecular weight (Mn) of the norbornene-based ring-opening copolymer according to the present invention is preferably 5000 to 500000, and more preferably 10000 to 200000. If the number average molecular weight of the norbornene-based ring-opening copolymer is less than the lower limit, the strength of the obtained norbornene-based ring-opening copolymer tends to be low. Meanwhile, if the number average molecular weight exceeds the upper limit, the melt viscosity of the obtained norbornene-based ring-opening copolymer tends to be too high.

Moreover, a molecular weight distribution (Mw/Mn) of the norbornene-based ring-opening copolymer according to the present invention is preferably 1.0 to 10, and more preferably 1.0 to 5.0. If the molecular weight distribution exceeds the upper limit, reverse dispersion characteristics of wavelength dispersion characteristics of a retardation film obtained by using the copolymer tend to be lowered.

Moreover, a glass transition temperature (Tg) of the norbornene-based ring-opening copolymer is preferably 110° C. or above, and more preferably 115 to 140° C. If the glass transition temperature is lower than the lower limit, it tends to be impossible to provide a sufficiently high level of heat resistance to the obtained retardation film. Meanwhile, if the glass transition temperature exceeds the upper limit, the film processability tends to be lowered.

A method for producing the norbornene-based ring-opening copolymer is not particularly limited. For example, it is possible to preferably employ a method in which a first norbornene monomer (hereinafter, simply referred to as a "spirotype norbornene-based monomer") represented by the following general formula (3):

[Chem. 5]

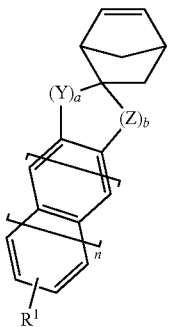

(3)

[in the formula (3), $R^1$, Y, Z, a, b, and n are synonymous with $R^1$, Y, Z, a, b, and n in the general formula (1), respectively], and a second norbornene monomer represented by the following general formula (4):

[Chem. 6]

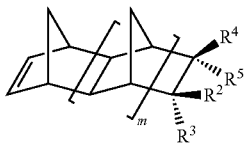

(4)

[in the formula (4), $R^2$, $R^3$, $R^4$, $R^5$, and m are synonymous with $R^2$, $R^3$, $R^4$, $R^5$, and m in the general formula (2), respectively] are subjected to a ring-opening polymerization, to thereby obtain the norbornene-based ring-opening copolymer containing the structural unit (A) represented by the general formula (1) and the structural unit (B) represented by the general formula (2). When the spiro-type norbornene-based monomer and the second norbornene monomer are subjected to a ring-opening polymerization in the method for producing a norbornene-based ring-opening copolymer, a norbornene-based ring-opening copolymer containing a structural unit (A) in which $X^1$ in the general formula (1) is the group represented by the formula: —CH=CH—, and a structural unit (B) in which $X^2$ in the general formula (2) is the group represented by the formula: —CH=CH— is obtained. Hence, after the ring-opening polymerization, a hydrogenation treatment may be further conducted to obtain a norbornene-based ring-opening copolymer containing a structural unit (A) in which $X^1$ in the general formula (1) is the group represented by the formula: —$CH_2CH_2$—, and a structural unit (B) in the general formula (2) is the group represented by the formula: —$CH_2CH_2$—.

The spiro-type norbornene monomer represented by the general formula (3) is not particularly limited. From the viewpoints of availability of a raw material for the synthesis, and easiness of the synthesis, preferred are 1,2-benzocyclopentene-3-spiro-5'-bicyclo[2.2.1]-2'-heptene,
1,2-benzocyclopentene-4-spiro-5'-bicyclo[2.2.1]-2'-heptene,
spiro[3,4-dihydro-2H-naphthalene-1,5'-2'-norbornene],
spiro[3,4-dihydro-1H-naphthalene-2,5'-2'-norbornene],
1,2-benzocyclooctene-3-spiro-5'-bicyclo[2.2.1]-2'-heptene,
1,2-benzocyclooctene-4-spiro-5'-bicyclo[2.2.1]-2'-heptene,
1,2-benzocyclooctene-5-spiro-5'-bicyclo[2.2.1]-2'-heptene,
2,3-benzocyclopentene-1-one-4-spiro-5'-bicyclo[2.2.1]-2'-heptene,
2,3-benzocyclopentene-1-one-5-spiro-5'-bicyclo[2.2.1]-2'-heptene,
3,4-benzocyclopentene-1-one-2-spiro-5'-bicyclo[2.2.1]-2'-heptene,
spiro[3,4-dihydronaphthalen-1-one-2,5'-2'-norbornene],
spiro[3,4-dihydronaphthalen-2-one-1,5'-2'-norbornene],
spiro[1,4-dihydronaphthalen-2-one-3,5'-2'-norbornene],
2,3-benzocyclooctene-1-one-8-spiro-5'-bicyclo[2.2.1]-2'-heptene,
3,4-benzocyclooctene-1-one-2-spiro-5'-bicyclo[2.2.1]-2'-heptene,
3,4-benzocyclooctene-1-one-8-spiro-5'-bicyclo[2.2.1]-2'-heptene,
spiro[3,4-dihydro-2H-anthracene-1,5'-2'-norbornene],
spiro[3,4-dihydro-1H-anthracene-2,5'-2'-norbornene],
spiro[3,4-dihydroanthracen-1-one-2,5'-2'-norbornene],
spiro[3,4-dihydroanthracen-2-one-1,5'-2'-norbornene], and
spiro[1,4-dihydroanthracen-2-one-3,5'-2'-norbornene].

A method for obtaining the spiro-type norbornene monomer is not particularly limited, and an example thereof is a method in which the spiro-type norbornene monomer is obtained by utilizing a reaction represented by the following reaction formula (I):

Reaction Formula (I)

[Chem. 7]

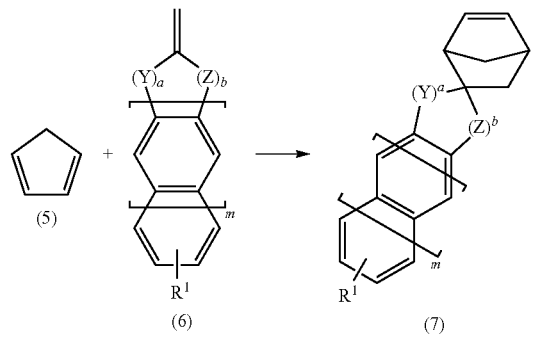

[in the reaction formula (I), $R^1$, Y, Z, a, and b are synonymous with $R^1$, Y, Z, a, and b in the general formula (1), respectively], where a cyclopentadiene represented by the general formula (5) and an exo-methylene compound represented by the general formula (6) are subjected to a Diels-Alder reaction.

The exo-methylene compound represented by the general formula (6) has an electron-withdrawing substituent, and hence acts as an excellent dienophile in the Diels-Alder reaction. For this reason, a desirable reaction rate for industrial production can be achieved by using the exo-methylene compound represented by the general formula (6). Moreover, the exo-methylene compound represented by the general formula (6) makes it possible to obtain the target spiro-type norbornene monomer almost quantitatively even under conditions of room temperature and no solvent. Further, a method for obtaining the exo-methylene compound represented by the general formula (6) is not particularly limited, and any known method can be employed as appropriate. Examples thereof include a method described in Organic Syntheses, Vol. 60, p. 88, and the like.

Examples of the second norbornene monomer represented by the general formula (4) include the following monomers:
bicyclo[2.2.1]hept-2-ene,
tetracyclo[4.4.1$^{2,5}$.1$^{7,10}$.0]-3-dodecene,
5-methylbicyclo[2.2.1]hept-2-ene,
5-ethylbicyclo[2.2.1]hept-2-ene,
5-methoxycarbonylbicyclo[2.2.1]hept-2-ene,
5-methyl-5-methoxycarbonylbicyclo[2.2.1]hept-2-ene,
5-cyanobicyclo[2.2.1]hept-2-ene,
8-methoxycarbonyltetracyclo[4.4.1$^{2,5}$.1$^{7,10}$.0]-3-dodecene,
8-ethoxycarbonyltetracyclo[4.4.1$^{2,5}$.1$^{7,10}$.0]-3-dodecene,
8-n-propoxycarbonyltetracyclo[4.4.1$^{2,5}$.1$^{7,10}$.0]-3-dodecene,
8-isopropoxycarbonyltetracyclo[4.4.1$^{2,5}$.1$^{7,10}$.0]-3-dodecene,
8-n-butoxycarbonyltetracyclo[4.4.1$^{2,5}$.1$^{7,10}$.0]-3-dodecene,
8-methyl-8-methoxycarbonyltetracyclo[4.4.1$^{2,5}$.1$^{7,10}$.0]-3-dodecene,
8-methyl-8-ethoxycarbonyltetracyclo[4.4.1$^{2,5}$.1$^{7,10}$.0]-3-dodecene,
8-methyl-8-n-propoxycarbonyltetracyclo[4.4.1$^{2,5}$.1$^{7,10}$.0]-3-dodecene,
8-methyl-8-isopropoxycarbonyltetracyclo[4.4.1$^{2,5}$.1$^{7,10}$.0]-3-dodecene,
8-methyl-8-n-butoxycarbonyltetracyclo[4.4.1$^{2,5}$.1$^{7,10}$.0]-3-dodecene, 5-ethylidenebicyclo[2.2.1]hept-2-ene,
8-ethylidenetetracyclo[4.4.1$^{2,5}$.1$^{7,10}$.0]-3-dodecene,
8-methyltetracyclo[4.4.1$^{2,5}$.1$^{7,10}$.0]-3-dodecene,
8-ethyltetracyclo[4.4.1$^{2,5}$.1$^{7,10}$.0]-3-dodecene,
8-propyltetracyclo[4.4.1$^{2,5}$.1$^{7,10}$.0]-3-dodecene,
8-isopropyltetracyclo[4.4.1$^{2,5}$.1$^{7,10}$.0]-3-dodecene,
8-n-butyltetracyclo[4.4.1$^{2,5}$.1$^{7,10}$.0]-3-dodecene,
5-n-butylbicyclo[2.2.1]hept-2-ene,
5-n-hexylbicyclo[2.2.1]hept-2-ene,
5-cyclohexylbicyclo[2.2.1]hept-2-ene,
5-(2-cyclohexenyl)bicyclo[2.2.1]hept-2-ene,
5-n-octylbicyclo[2.2.1]hept-2-ene,
5-n-decylbicyclo[2.2.1]hept-2-ene,
5-isopropylbicyclo[2.2.1]hept-2-ene,
5-cyclohexenylbicyclo[2.2.1]hept-2-ene,
5-fluorobicyclo[2.2.1]hept-2-ene,
5,5-difluorobicyclo[2.2.1]hept-2-ene,
5,6-difluorobicyclo[2.2.1]hept-2-ene,
5,5,6-trifluorobicyclo[2.2.1]hept-2-ene,
5,5,6,6-tetrafluorobicyclo[2.2.1]hept-2-ene,
8-fluorotetracyclo[4.4.1$^{2,5}$.1$^{7,10}$.0]-3-dodecene,
8,8-difluorotetracyclo[4.4.1$^{2,5}$.1$^{7,10}$.0]-3-dodecene, dicyclopentadiene, tricyclopentadiene, tetracyclopentadiene, indene-cyclopentadiene adduct (1,4-methano-1,4,4a,9a-tetrahydro fluorene), and the like.

In addition, a method for producing the second norbornene monomer represented by the general formula (4) is not particularly limited, and any known method can be employed as appropriate. Moreover, a commercially available norbornene monomer may be used as the second norbornene monomer represented by the general formula (4).

Meanwhile, as a ring-opening polymerization catalyst used in a reaction in which the spiro-type norbornene monomer represented by the general formula (3) and the second norbornene monomer represented by the general formula (4) are subjected to a ring-opening copolymerization, a metathesis polymerization catalyst described in Olefin Metathesis and Metathesis Polymerization (K. J. IVIN, J. C. MOL, Academic Press, 1997) is used. Specifically, the catalyst comprises a combination of (a) at least one selected from compounds containing W, Mo, Re, V, or Ti, and (b) at least one selected from compounds containing Li, Na, K, Mg, Ca, Zn, Cd, Hg, B, Al, Si, Sn, Pb, or the like and having at least one bond between the element and carbon or at least one bond between the element and hydrogen. In this case, an additive (c), which will be described later, may be added to enhance the catalytic activity. In addition, examples of other catalysts include metathesis catalysts (d) which do not require any auxiliary catalyst, comprising periodic table Group 4 to 8 transition metal-carbene complexes, metallacyclobutene complexes, and the like. Here, representative examples of the compounds containing W, Mo, Re, V, or Ti appropriate as the component (a) include $WCl_6$, $MoCl_5$, $ReOCl_3$, $VOCl_3$, $TiCl_4$, and the like. Meanwhile, specific examples of the compounds used as the component (b) include compounds such as n-$C_4H_9Li$, $(C_2H_5)_3Al$, $(C_2H_5)_2AlCl$, $(C_2H_5)_{1.5}AlCl_{1.5}$, $(C_2H_5)AlCl_2$, methylalumoxane, and LiH. Furthermore, as for representative examples of the additive as the component (c), alcohols, aldehydes, ketones, amines, and the like can be used. Meanwhile, representative examples of the component (d) include W(=N-2,6-$C_6H_3iPr_2$) (=CHtBu) (OtBu)$_2$, Mo(=N-2,6-$C_6H_3iPrA$) (=CHtBu) (OtBu)$_2$, Ru(=CHCH=CPh$_2$) (PPh$_3$)$_2$Cl$_2$, Ru(=CHPh) (PC$_6H_{11}$)$_2$Cl$_2$ (Grubbs I (first generation) catalysts), Grubbs II (second generation) catalysts, Hoveyda-Grubbs catalysts (first and second generations), and the like.

An amount of the metathesis catalyst used is such that a ratio between the component (a) and a sum total of the spiro norbornene monomer and the second norbornene monomer "component (a):sum total of spiro-type norbornene monomer and second norbornene monomer" is preferably in a range from 1:500 to 1:500000, and more preferably in a range from 1:1000 to 1:100000 in terms of molar ratio. Moreover, a ratio between the component (a) and the component (b) "component (a):component (b)" is preferably in a range from 1:1 to 1:100, and more preferably in a range from 1:2 to 1:50, in terms of metal atom ratio. Furthermore, a ratio between the component (a) and the component (c) "component (c):component (a)" is preferably in a range from 0.005:1 to 15:1, and more preferably in a range from 0.05:1 to 10:1, in terms of molar ratio. Meanwhile, the amount of the catalyst (d) used is such that a ratio between the component (d) and the sum total of the spiro-type norbornene monomer and the second norbornene monomer "component (d):sum total of spiro-type norbornene monomer and second norbornene monomer" is preferably in a range from 1:30 to 1:100000, and more preferably in a range from 1:50 to 1:50000, in terms of molar ratio.

In addition, a method for controlling the molecular weight of an obtained norbornene-based ring-opening copolymer in the reaction in which the spiro-type norbornene monomer and the second norbornene monomer are subjected to the ring-opening polymerization is not particularly limited. For example, a method for appropriately controlling the molecular weight by changing a polymerization temperature, a kind of the catalyst, a kind of the solvent, and the like may be employed. Here, as the method for controlling the molecular weight, a method in which a molecular weight controlling agent is coexistent in the reaction system can be preferably employed. Preferred examples of the molecular weight controlling agent include α-olefins such as ethylene, propene, 1-butene, 1-pentene, 1-hexene, 1-heptene, 1-octene, 1-nonene, and 1-decene; and styrene. Among these, 1-hexene and 1-decene are particularly preferable. These molecular weight controlling agents can be used alone or as a mixture of two or more kinds. An amount of the molecular weight controlling agent used is preferably in a range from 0.001 to 1.0 mol, and more preferably in a range from 0.005 to 0.1 mol, relative to 1 mol of the sum total of the spiro-type norbornene monomer and the second norbornene monomer.

Moreover, as the solvent used in the reaction in which the spiro-type norbornene monomer and the second norbornene monomer are subjected to a ring-opening copolymerization, a solvent which dissolves the spiro-type norbornene monomer, the second norbornene monomer, the metathesis catalyst, and the molecular weight controlling agent is preferable. Examples thereof include alkanes such as pentane, hexane, heptane, octane, nonane, and decane; cycloalkanes such as cyclohexane, cycloheptane, cyclooctane, decaline, and norbornane; aromatic hydrocarbons such as benzene, toluene, xylene, ethylbenzene, and cumene; halogenated alkanes such as chlorobutane, bromohexane, methylene chloride, dichloroethane, hexamethylene dibromide, chlorobenzene, chloroform, and tetrachloroethylene; compounds such as aryls; saturated carboxylic esters such as ethyl acetate, n-butyl acetate, iso-butyl acetate, methyl propionate, dimethoxyethane, and γ-butyrolactone; and ethers such as dibutyl ether, tetrahydrofuran, and dimethoxyethane. Among these, aromatic hydrocarbons are preferable. These solvents can be used alone or as a mixture of two or more kinds. An amount of the solvent used is preferably an amount which satisfies a condition that a mass ratio "solvent:sum total of spiro-type norbornene monomer and second norbornene monomer" is 1:1 to 30:1, and more preferably an amount which satisfies a condition that the mass ratio is 1:1 to 20:1.

In addition, the norbornene-based ring-opening copolymer obtained in a state where the spiro-type norbornene-based monomer represented by the general formula (3) and the second norbornene monomer represented by the general formula (4) are subjected to a ring-opening polymerization contains the structural unit (A) in which $X^1$ in the general formula (1) is the group represented by the formula: —CH=CH—, and the structural unit (B) in which $X^2$ in the general formula (2) is the group represented by the formula: —CH=CH—. The norbornene-based ring-opening copolymer has vinylene groups in the structural units (hereinafter, referred to as a "vinylene group-containing copolymer" in some cases). The vinylene group-containing copolymer can be used directly for the retardation film of the present invention for various applications. However, from the viewpoint of further improving heat stability of an obtained retardation film, it is preferable to form a norbornene-based ring-opening copolymer (hereinafter, referred to as a "hydrogenated product" in some cases) containing the structural unit (A) in which $X^1$ in the general formula (1) is the group represented by the formula: —CH$_2$CH$_2$—, and the structural unit (B) in which $X^2$ in the general formula (2) is the group represented by the formula: —CH$_2$CH$_2$—, by hydrogenating a part or all of the vinylene groups of the norbornene-based ring-opening copolymer (vinylene group-containing copolymer). In the hydrogenated product, substantially no aromatic rings in the side chains in the structural units derived from the spiro-type norbornene monomer are hydrogenated. In addition, a hydrogenation percentage of the vinylene groups is preferably 90% or more, more preferably 95% or more, and particularly preferably 98% or more. There is a tendency that, as the hydrogenation percentage of the vinylene groups rises, the heat resistance of an obtained norbornene-based ring-opening copolymer is more improved, so that coloring and deterioration due to heat are more sufficiently suppressed.

Moreover, a reaction of hydrogenating the vinylene group-containing copolymer needs to be carried out under the condition where substantially no aromatic rings in the side chains are hydrogenated as described above. The reaction is generally carried out by adding a hydrogenation catalyst to a solution of the vinylene group-containing copolymer, and causing a hydrogen gas to act thereon at normal pressure to 30 MPa, preferably 3 to 20 MPa, at 0 to 200° C., preferably 20 to 180° C.

Moreover, as the hydrogenation catalyst used in the hydrogenation reaction, those used for hydrogenation reaction of ordinary olefinic compounds can be used. Both heterogeneous catalysts and homogeneous catalysts can be employed. Specific examples of the heterogeneous catalysts include solid catalysts in which a noble metal catalyst substance such as palladium, platinum, nickel, rhodium, or ruthenium is supported on a support such as carbon, silica, alumina, or titania. Meanwhile, specific examples of the homogeneous catalysts include nickel naphthenate/triethylaluminum, nickel acetylacetonate/triethylaluminum, cobalt octenoate/n-butyllithium, titanocene dichloride/diethylaluminum monochloride, rhodium acetate, chlorotris(triphenylphosphine) rhodium, dichlorotris(triphenylphosphine)ruthenium, chlorohydrocarbonyltris(triphenylphosphine)ruthenium, dichlorocarbonyltris(triphenylphosphine)ruthenium, dichlorocarbonyltris(triphenylphosphine)ruthenium, tricarbonyltris(triphenylphosphine)ruthenium, dihydrocarbonyltris(triphenylphosphine)ruthenium, hydrocarbomethoxycarbonyltris(triphenylphosphine)ruthenium, and the like. The form of the hydrogenation catalyst may be powder or particulate.

Furthermore, an amount of the hydrogenation catalyst added needs to be adjusted in order that substantially no aromatic rings in the spiro-type norbornene monomer will be hydrogenated. Accordingly, the hydrogenation catalyst is preferably used in such an amount that a weight ratio "ring-opening copolymer:hydrogenation catalyst" can be $1:1\times10^{-6}$ to 1:2.

Moreover, the retardation film of the present invention is formed by stretching a film comprising the above-described norbornene-based ring-opening copolymer according to the present invention. A method for producing the film comprising the norbornene-based ring-opening copolymer is not particularly limited, and any known method can be employed as appropriate. Moreover, other polymers, surfactants, polymer electrolytes, conductive complexes, silica, alumina, coloring materials, heat stabilizers, ultraviolet absorbers, antistats, anti-blocking agents, lubricants, plasticizers, oils, and the like may be added in the production of the film, within a range which does not exceed the gist of the present invention. In addition, a method for stretching the norbornene-based ring-opening copolymer having been formed into a film is not particularly limited, and any conventionally known stretching method can be employed as appropriate.

Further, preferred examples of a method for producing the film of the norbornene-based ring-opening copolymer include publicly-known and publicly-used methods such as a casting method (a solution casting method), a melt extrusion method, a calendaring method, and a compression molding method. Additionally, as a molding apparatus used in the casting method, a drum-type casting machine, a band-type casting machine, a spin coater, or the like can be used. In addition, examples of the melt extrusion method include a T-die method and an inflation method.

Moreover, specific examples of a solvent used for the casting method include cyclic ketones such as cyclohexanone and cyclopentanone; lactones such as γ-butyrolactone and δ-valerolactone; aromatic hydrocarbons such as benzene, toluene, xylene, ethylbenzene, and cumene; halogenated alkanes such as methylene chloride, dichloroethane, chlorobenzene, dichlorobenzene, chloroform, and tetrachloroethylene; compounds such as aryls; ethers such as dibutyl ether, tetrahydrofuran, and dimethoxyethane; and polar solvents such as N-methylpyrrolidone, N,N-dimethylformamide, N,N-dimethylacetamide, and dimethyl sulfoxide. Among these, aromatic hydrocarbons, halogenated alkanes, and aryls are preferable. Note that these solvents may be used alone or as a mixture of two or more kinds.

Furthermore, examples of a method for stretching the norbornene-based ring-opening copolymer having been formed into a film include biaxial stretching methods such as a tentering method and a tube method and further include uniaxial stretching methods such as a water-tank stretching method, a radiation stretching method, a hot-air heating method, a hot-plate heating method, and a roll heating method.

A thickness of the thus obtained retardation film of the present invention is not particularly limited, and is desirably 10 to 300 µm, and more preferably 30 to 200 µm. If the thickness of the retardation film is less than 10 µm, mechanical characteristics and handling ability in a secondary processing tend to be lowered. Meanwhile, if the thickness exceeds 300 µm, a problem associated with flexibility tends to arise. In addition, a stretching ratio for obtaining the retardation film of the present invention is also not particularly limited, and is preferably about 1.1 to 5.0 times.

A retardation value of the retardation film of the present invention should be selected within a range from 5 to 2000 nm according to the purpose. When the retardation film is used as a ½λ plate, a retardation of visible light at a wavelength of 550 nm is desirably 200 to 400 nm. When the retardation film is used as a ¼λ plate, a retardation of visible light at a wavelength of 550 nm is desirably 90 to 200 nm.

Furthermore, the retardation film of the present invention may further comprise a thin film for the purpose of providing functions such as gas barrier, anti-scratching, chemical resistance, and anti-glare. As a method for forming such a thin film, for example, a method may be employed in which a polymerization inhibitor, a wax, a dispersant, a coloring material, a solvent, a plasticizer, an ultraviolet absorber, an inorganic filler, and the like are added to any of various thermoplastic resins, thermosetting resins having an amino group, an imino group, an epoxy group, a silyl group, or the like, and radiation curable resins having an acryloyl group, a methacryloyl group, a vinyl group, or the like, or to a mixture of any of these resins, and then the mixture is applied by a method such as a gravure roll coating method, a Meyer bar coating method, a reverse roll coating method, a dip coating method, an air knife coating method, a calendar coating method, a squeeze coating method, a kiss coating method, a fountain coating method, a spray coating method, a spin coating method, or the like. In addition, the thin film may be converted into a cured thin-film layer by performing, after the application, curing by radiation irradiation or thermal curing by heat, if necessary. Meanwhile, when printing is performed for the formation of the thin film, a method such as a gravure method, an offset method, a flexo method, or a silk screen method can be used. In addition, the retardation film of the present invention may further comprise a metal oxide layer mainly containing aluminum, silicon, magnesium, zinc, or the like for the purpose of providing gas sealing function and the like. The metal oxide layer is formed by a vacuum deposition method, a sputtering method, an ion-plating method, a plasma CVD method, or the like.

Moreover, the retardation film of the present invention may be laminated with another film. As a method for the lamination, any conventionally known method can be employed as appropriate, and examples thereof include thermal bonding methods such as a heat sealing method, an impulse sealing method, an ultrasonic bonding method, and a high-frequency bonding method; laminating methods such as an extrusion laminating method, a hot-melt laminating method, a dry laminating method, a wet laminating method, a solventless bonding laminating method, a thermal laminating method, and a co-extrusion method; and the like. In addition, examples of the film to be laminated include polyester-based resin films, polyvinyl alcohol-based resin films, cellulose-based resin films, polyvinyl fluoride resin films, polyvinylidene chloride resin films, polyacrylonitrile resin films, nylon-based resin films, polyethylene-based resin films, polypropylene-based resin films, acetate resin films, polyimide resin films, polycarbonate resin films, polyacrylate-based resin films, and the like.

Next, a liquid crystal display device of the present invention is described. Specifically, the liquid crystal display device of the present invention comprises the above-described retardation film of the present invention.

Even when the above-described retardation film of the present invention is a single layer film, the retardation film has a high transparency and an excellent wavelength dispersibility, and provides a specific retardation to light over a wide band. The retardation film also can attain optical characteristics as a negative A which are unique even among negative birefringence characteristics, and can attain a reverse dispersion of birefringence wavelength dispersion characteristics. Accordingly, the retardation film of the present invention is useful as a ¼λ plate in a reflective liquid crystal display device, a ½λ plate and a ¼λ plate in a liquid crystal projector apparatus, a ½λ plate and a ¼λ plate in a transmission liquid crystal display device, a protection film for a polarizing film used in a liquid crystal display device, an anti-reflection film, and the like.

Therefore, the liquid crystal display device of the present invention is only required to comprise the retardation film of the present invention as a ½λ plate, a ¼λ plate, a protection film, an anti-reflection film, or the like. Accordingly, other configurations may be the same as those of any conventionally known liquid crystal display device.

Subsequently, an organic EL display device (organic electroluminescence device) of the present invention is described. Specifically, the organic EL display device of the present invention comprises the above-described retardation film of the present invention.

The organic EL display device of the present invention is also only required to comprise the retardation film of the present invention as a ½λ plate, a ¼λ plate, a protection film, an anti-reflection film, or the like, as in the case with the above-described liquid crystal display device of the present invention. Accordingly, other configurations may be the same as those of any conventionally known organic EL display device.

Hereinafter, a preferred example of use of the retardation film of the present invention in an organic EL display device is described. Here, a case where the organic EL display device comprises a light emitter (organic electroluminescence light emitter) obtained by sequentially stacking a transparent electrode, an organic light emitting layer, and a metal electrode on a transparent substrate is considered. In general, the organic electroluminescence light emitter has the following problem. Specifically, light incident on a surface of the transparent substrate is transmitted through the transparent electrode and the organic light emitting layer, is reflected by the metal electrode, and is emitted from the surface of the transparent substrate again to the outside. As a result, a display surface of the organic EL display device looks like a mirror surface, when viewed from the outside. In this respect, when such an organic electroluminescence light emitter is used, for example, an anti-reflection film is formed by using the retardation film of the present invention, and placed on the transparent substrate side (light emitting side) of the organic electroluminescence light emitter for use. When the retardation film of the present invention is provided as described above, the obtained organic EL display device achieves a great external light reflection prevention effect, and has sufficiently excellent viewability.

Note that a method for producing a ½λ plate, a ¼λ plate, a protection film for a polarizing film, an anti-reflection film, or the like by use of the retardation film of the present invention is not particularly limited, and any known method can be used as appropriate, as long as the retardation film of the present invention is used as a retardation film. For example, when the retardation film of the present invention is used as an anti-reflection film as described above, a circularly polarizing plate may be obtained by pasting the retardation film of the present invention on a surface of a known polarizing plate.

Moreover, the retardation film of the present invention can also be used as a transparent electrode film in a touch panel, a liquid crystal display device, or the like, after a ceramic thin film of indium tin oxide, indium zinc oxide, or the like is formed on a surface of the retardation film of the present invention by a plasma process using DC or glow discharge.

EXAMPLES

Hereinafter, the present invention will be described more specifically based on Examples and Comparative Examples. However, the present invention is not limited to Examples below.

First, a description is given of methods for evaluating characteristics of compounds respectively obtained in Synthesis Examples and retardation films respectively obtained in Examples.

<Glass Transition Temperature: Tg>

The glass transition temperatures of the hydrogenated products of ring-opening copolymers respectively obtained in Examples were measured by using a differential scanning calorimeter (manufactured by Perkin-Elmer, product name: DSC7) at a rate of temperature rise of 10° C. per minute under nitrogen stream.

<Molecular Weight and Molecular Weight Distribution>

The weight average molecular weights (Mw) in terms of polystyrene and the molecular weight distributions (Mw/Mn) of the polymers respectively obtained in Synthesis Examples and the hydrogenated products of ring-opening copolymers respectively obtained in Examples were determined by using a gel permeation chromatography (GPC, manufactured by Tosoh Corporation, product name: HLC-8020/4 columns: manufactured by Tosoh Corporation, product name: TSK gel GMH$_{HR}$) as a measuring apparatus, and tetrahydrofuran (THF) as a solvent. Here, Mn represents a number average molecular weight.

<Molecular Structures of Monomers and Polymers>

$^1$H and $^{13}$C-NMR of the polymers respectively obtained in Synthesis Examples were measured in deuterated chloroform by using a superconducting nuclear magnetic resonance spectrometer (NMR, manufactured by VARIAN, Inc., product name: UNITY INOVA-600). Based on obtained data, calculation was performed for the hydrogenation percentage of a monomer and the polymer (a percentage of $X^1$ and $X^2$ in the structural units represented by the general formulae (1) and (2) in the norbornene-based ring-opening copolymer having been converted into the group represented by the formula: —CH$_2$CH$_2$—), and identification of molecular structure thereof was carried out.

<Evaluations of Retardation and Birefringence, and Evaluation of Wwavelength Dispersion Value of Birefringence>

The retardation films respectively obtained in Examples were subjected to measurements of a refractive index, a retardation (Re), and a wavelength dispersion value (D) of birefringence, which are defined by the following formulae, by using a polarization-retardation measuring apparatus (manufactured by AXOMETRICS, Inc., product name: AxoScan).

Retardation(Re):Re=(Nx−Ny)×d

Nx: refractive index in a stretching direction (X-direction)
Ny: refractive index in a direction (Y-direction) perpendicular to the stretching direction
Nz: refractive index in a direction (Z-direction: thickness direction) perpendicular to the X-direction and the Y-direction
d: film thickness (nm)
Wavelength dispersion value (D) of birefringence: D=Δn (λ=450 nm)/Δn (λ=550 nm).

Next, a monomer used in each Example is described.

Synthesis Example 1

Firstly, according to a method described in "Organic Syntheses, Vol. 60," p. 88,α-tetralone, paraformaldehyde, and N-methylanilinium trifluoroacetate were reacted with each other, to synthesize 2-methylene-1-oxo-1,2,3,4-tetrahydronaphthalene (yield: 54%).

Next, 2-methylene-1-oxo-1,2,3,4-tetrahydronaphthalene (15.82 g, 0.10 mol) was mixed with cyclopentadiene (13.22 g, 0.20 mol) to obtain a mixture. Subsequently, under conditions of a nitrogen atmosphere and room temperature (25° C.), the mixture was stirred for 20 hours, and excessive cyclopentadiene was removed with a rotary evaporator. Thereby, an oily substance was obtained. Next, the oily substance thus obtained was purified by distillation with a Kugelrohr (150° C./1 mmHg), and 22.00 g of a pale yellow liquid substance was obtained (yield: 98%). The liquid substance thus obtained was subjected to NMR analysis. As a result, it was confirmed that the product was spiro[3,4-dihydronaphthalen-1-one-2,5'-2'-norbornene].

Example 1

<Polymerization Step>

Under a nitrogen atmosphere, spiro[3,4-dihydronaphthalen-1-one-2,5'-2'-norbornene] obtained in Synthesis Example 1 (3.589 g, 16 mmol; hereinafter, simply referred to as "Monomer A" in some cases), dicyclopentadiene (DCPD, manufactured by Maruzen Petrochemical under the product name of "High-purity Dicyclopentadiene HDCP", 3.173 g, 24 mmol; hereinafter, simply referred to as "Monomer B" in some cases), an anhydrous toluene solution (58 ml), 1-decene (75.8 μl: 1.0 mol %), a 15% by mass toluene solution of triethylaluminum (8.7 μl: 0.025 mol %), and an anhydrous toluene solution (10 ml) of Grubbs II (0.86 mg: 0.0025 mol %) were added to a 100-ml three-necked flask, and stirred at 100° C. for 9 hours to obtain a viscous polymer solution. Subsequently, a dilute liquid was obtained by diluting the polymer solution with 200 ml of toluene. Then, the dilute liquid was poured into 2000 ml of methanol to from precipitates, and the precipitates were collected by filtration. Subsequently, the precipitates thus obtained were dried in a vacuum dryer, and 6.22 g of a ring-opening copolymer of dicyclopentadiene/spiro[3,4-dihydronaphthalen-1-one-2,5'-2'-norbornene] (norbornene-based ring-opening copolymer (I)) was obtained (yield: 92%, the molar ratio between Monomer A and Monomer B (A:B) was 40:60). The norbornene-based ring-opening copolymer (I) thus obtained was examined by GPC. As a result, the weight average molecular weight (Mw) thereof was 60,000 in terms of polystyrene, and Mw/Mn thereof was 4.0.

<Hydrogenation Step>

Next, the norbornene-based ring-opening copolymer (I) was hydrogenated. In the hydrogenation, first, a mixture was obtained by introducing 6.0 g of the norbornene-based ring-opening copolymer (I), 60 ml of toluene, and 12.0 mg of RuHCl (CO) (PPh$_3$)$_3$ into an autoclave having a capacity of 0.2 L. Then, the inside of the autoclave was replaced by nitrogen. Subsequently, the mixture was heated for 4 hours in the autoclave under conditions of a hydrogen gas pressure of 10 MPa and a temperature of 165° C. Thus, a hydrogenation reaction of the norbornene-based ring-opening copolymer (I) was performed to obtain a reaction solution. Next, the reaction solution was naturally cooled to 30° C., and then the pressure of the hydrogen gas in the autoclave was released. Subsequently, the reaction solution was diluted with 200 ml of toluene, and then poured into 2000 ml of methanol. The formed precipitates were separated and collected. Thereafter, the obtained precipitates were dried, and 5.5 g of a hydrogenated product of the ring-opening copolymer of dicyclopentadiene/spiro[3,4-dihydronaphthalen-1-one-2,5'-2'-norbornene] (a hydrogenated product of the norbornene-based ring-opening copolymer (I)) was obtained (yield 92%).

<Characteristics Evaluation of Hydrogenated Product>

A hydrogenation percentage of olefinic unsaturated bonds was measured by NMR for the thus obtained hydrogenated product of the norbornene-based ring-opening copolymer (I). The FIGURE shows the obtained NMR chart. From the result of the NMR measurement, it was found that the hydrogenation percentage in the hydrogenated product of the norbornene-based ring-opening copolymer (I) was 99.0%. In addition, from the NMR chart obtained by the measurement, it was found that substantially no aromatic rings in the hydrogenated product of the norbornene-based ring-opening copolymer (I) were hydrogenation. Furthermore, the hydrogenated product of the norbornene-based ring-opening copolymer (I) was examined by GPC and DSC. As a result, it was found that the weight average molecular weight (Mw) thereof was 64,000 in terms of polystyrene, the Mw/Mn thereof was 3.4, and the Tg thereof was 120° C.

<Film Formation>

Next, a retardation film of the present invention was produced by using the hydrogenated product of the norbornene-based ring-opening copolymer (I). Specifically, first, a chlorobenzene solution containing the hydrogenated product of the norbornene-based ring-opening copolymer (I) at a concentration of 10% by weight was prepared, and filtered through a 0.2-μm filter. Next, the chlorobenzene solution was cast on a glass plate into a film-like shape by a casting method such that the film after drying had a film thickness of 50 μm to 100 μm. Then, the chlorobenzene solution was dried naturally for 72 hours to obtain a film. Subsequently, the film was peeled from the glass plate, and then dried by using a vacuum dryer maintained at a temperature (Tg-10° C.) lower, by 10° C., than the Tg of the hydrogenated product of the norbornene-based ring-opening copolymer (I) used as a material of the film, until a residual solvent concentration reached 1.0% by weight or less. Thus, a dry film was obtained. Next, the obtained dry film was cut into strips (Size: 5.0×4.0 cm), and uniaxially stretched by using a biaxial stretching apparatus (manufactured by Shibayama Scientific Co., Ltd.: SS-60 model) under a condition of a temperature (Tg+10° C.) higher, by 10° C., than the Tg of the hydrogenated product of the norbornene-based ring-opening copolymer (I) used as the material of the film at a stretching speed of 50 mm/minute with a stretching ratio of 200% (2.0 times). Thus, a retardation film was obtained.

Table 1 shows the retardation, wavelength dispersion value, and refractive index values (Nx, Ny, Nz), of the retardation film thus obtained, measured by use of the methods described in the above evaluation methods. In addition, Table 1 also shows the weight average molecular weight (Mw), and the molecular weight distribution (Mw/Mn) in terms of polystyrene of the obtained copolymer.

Examples 2 to 7

Norbornene-based ring-opening copolymers and retardation films using the norbornene-based ring-opening copolymers were produced in the same manner as in Example 1, except that the amounts of Monomer A and Monomer B added were changed such that the content ratios between Monomer A and Monomer B were the monomer ratios described in Table 1 below.

Table 1 shows the retardation, wavelength dispersion value, and refractive index values (Nx, Ny, Nz), of the retardation film thus obtained in each Example, measured by use of the methods described in the above evaluation methods. In addition, Table 1 also shows the Tg, weight average molecular weight (Mw), and molecular weight distribution (Mw/Mn) in terms of polystyrene of the copolymer obtained in each Example.

TABLE 1

| | Monomer ratio [A:B]*[1] | Weight average molecular weight | Molecular weight distribution | Retardation (nm) | Refractive index | | | Tg [° C.] | Wavelength dispersion value D*[2] |
|---|---|---|---|---|---|---|---|---|---|
| | | | | | Nx | Ny | Nz | | |
| Example 1 | 40/60 | 64000 | 3.4 | 95 | 1.565 | 1.563 | 1.563 | 120 | 0.93 |
| Example 2 | 42/58 | 95000 | 4.6 | 97 | 1.566 | 1.564 | 1.564 | 121 | 0.89 |
| Example 3 | 44/56 | 117000 | 5.0 | 75 | 1.567 | 1.565 | 1.565 | 122 | 0.86 |
| Example 4 | 46/54 | 97000 | 5.4 | 34 | 1.568 | 1.566 | 1.566 | 123 | 0.78 |
| Example 5 | 50/50 | 122000 | 4.6 | 47 | 1.570 | 1.568 | 1.568 | 125 | 0.73 |

TABLE 1-continued

| | Monomer ratio [A:B]*1 | Weight average molecular weight | Molecular weight distribution | Retardation (nm) | Refractive index | | | Tg [° C.] | Wavelength dispersion value D*2 |
|---|---|---|---|---|---|---|---|---|---|
| | | | | | Nx | Ny | Nz | | |
| Example 6 | 60/40 | 121000 | 4.4 | 47 | 1.572 | 1.574 | 1.574 | 130 | 1.33 |
| Example 7 | 70/30 | 139000 | 4.3 | 104 | 1.575 | 1.578 | 1.578 | 136 | 1.17 |

In the table,
*1 indicates that the monomer ratio is a molar ratio ([Monomer A]:[Monomer B]) between Monomer A (spiro[3,4-dihydronaphthalen-1-one-2, 5'-2'-norbornene) and Monomer B (DCPD]).
*2 indicates that D is a value obtained by calculation of [birefringence Δn for light with wavelength of 450 nm]/[birefringence Δn for light with wavelength of 550 nm].

As is apparent from the results shown in Table 1, it was found that the retardation films of the present invention (Examples 1 to 7) were retardation films having a sufficiently high level of heat resistance (each copolymer had a Tg of 120° C. or above). In addition, it was also found that the norbornene-based ring-opening copolymer obtained in each Example had a sufficiently high processability.

In addition, as is apparent from the results shown in Table 1, it was found that the wavelength dispersion values of birefringence {D=(Δn: λ450 nm)/(Δn: Δ550 nm)} of the retardation films varied depending on the ratio of the monomers used, and it was found that the retardation films obtained in Examples 1 to 5 were reverse dispersion retardation films. Moreover, it was found that the retardation films obtained in Examples 6 and 7 were retardation films having negative A characteristics, because these retardation films satisfied a relationship represented by an inequality (1):

$$Ny=Nz>Nx \quad (1)$$

As described above, it was found that the retardation films of the present invention (Examples 1 to 7) exhibited excellent optical characteristics, and functioned sufficiently as retardation films.

Comparative Example 1

A retardation film for comparison was obtained by employing the same film formation step as that employed in Example 1, except that a hydrogenated product of a polymer of spiro[norcamphor-3,3'-bicyclo[2.2.1.]hept-5-ene] (a spiro-type norbornene monomer other than those represented by the general formula (3)) was used instead of the hydrogenated product of the norbornene-based ring-opening copolymer (I).

The refractive index values (Nx, Ny, Nz) and birefringence (Δn: λ590 nm) of the thus obtained retardation film for comparison (Comparative Example 1) was measured at a wavelength of 590 nm by using a polarization-retardation measuring apparatus (manufactured by AXOMETRICS, Inc., product name: AxoScan). In addition, the birefringence of the retardation film obtained in Example 7 was also measured in the same manner.

The results of these measurements showed that the refractive indexes of the retardation film obtained in Comparative Example 1 were such that Nx was 1.5923, Ny was 1.5919, and Nz was 1.5919. In addition, the birefringence Δn of the retardation film obtained in Comparative Example 1 was 0.00037. On the other hand, the birefringence Δn of the retardation film obtained in Example 7 was 0.00296.

From these measurement results, it is found that the refractive indexes (Nx, Ny, Nz) of the retardation film obtained in Comparative Example 1 satisfied a relationship represented by the following inequality (2):

$$Nx>Ny=Nz \quad (2)$$

Note that a retardation film satisfying the relationship shown in the inequality (2) has the so-called positive A characteristics. Accordingly, it was found that the retardation film obtained in Comparative Example 1 had positive A characteristics.

Since the polymer of the spiro-type norbornene monomer used in Comparative Example 1 had positive A characteristics as described above, it can be understood that, when such a monomer is copolymerized with a monomer represented by the general formula (4) of the present invention, the obtained copolymer does not exhibit negative A characteristics or reverse dispersion characteristics.

In addition, it can be seen that the retardation film obtained in Comparative Example 1 had an extremely small value of the birefringence Δn, in comparison with the retardation film obtained in Example 7. In addition, when use of the retardation film (Comparative Example 1) as a ¼λ plate is considered on the basis of the value (0.00037) of the birefringence Δn of the retardation film obtained in Comparative Example 1, it has been found that the film thickness of the retardation film needs to be 378 μm in order for the retardation film to function as a ¼λ plate. If used as a ¼λ plate, the retardation film obtained in Comparative Example 1 needs to be a film having an extremely large thickness of 378 μm as described above. Hence, it has been found that the retardation film obtained in Comparative Example 1 has problems in terms of costs and thin film formation, and is not sufficient in terms of practical use.

Production Example 1

Fabrication of Circularly Polarizing Plate

First, a polarizing plate (manufactured by Sumitomo Chemical Company, Limited) obtained by causing iodine to be adsorbed onto a stretched polyvinyl alcohol was prepared. Next, the retardation film obtained in Example 1 was pasted on a surface of the polarizing plate by using an acrylic-based adhesive agent, with the slow axis of the retardation film crossing with the absorption axes of the polarizing plate at an angle of 45°. Subsequently, a saponified cellulose triacetate film (manufactured by FUJIFILM Corporation) was pasted on the other surface of the polarizing plate by using an acrylic-based adhesive agent. Thus, a circularly polarizing plate was produced.

The circularly polarizing plate obtained in Production Example 1 was subjected to polarization analysis by use of an ellipsometer (manufactured by Mizojiri Optical Co., Ltd. under the product name of "DVA-36VWLD"). As a result, the elasticity was 0.94 at a wavelength of 550 nm. From these results, it was found that the use of the retardation film of the present invention (Example 1) made it possible to obtain a circularly polarizing plate having good circular-polarization characteristics. In addition, optical inspection conducted on the circularly polarizing plate being obtained in Production Example 1 and comprising the retardation film of the present invention did not detect any damage such as a stain or a scar in the retardation film.

Next, by using the circularly polarizing plate being obtained in Production Example 1 and comprising the retardation film of the present invention, a laminate was formed in which a retardation film side of the circularly polarizing plate was pasted on a glass plate with an acrylic-based sticky agent. Subsequently, the laminate was placed in a constant temperature and humidity chamber kept at a temperature of 60° C. and a relative humidity RH of 90%. After 500 hours had elapsed, the laminate was taken out and observed. As a result, no abnormality such as peeling or bubble formation was observed in the laminate at all. Form these results, it was found that even when the retardation film of the present invention was used for a long time, peeling and bubble formation were sufficiently suppressed.

Example 8

The circularly polarizing plate being obtained in Production Example 1 and comprising the retardation film of the present invention was pasted on a transparent substrate placed on a viewing side of a light-emitting surface of a commercially available organic EL display with an acrylic-based sticky agent. Thus, an organic EL display device comprising the retardation film of the present invention was obtained.

Comparative Example 2

An organic EL display device for comparison was obtained in the same manner as in Example 8, except that a commercially available optical film (manufactured by Zeon Corporation under the product name of "ZEONOR Film") was used instead of the circularly polarizing plate obtained in Production Example 1.

[Characteristics Evaluation of Organic EL Display Devices]

Each of the organic EL display devices obtained in Example 8 and Comparative Example 2 was caused to emit light by voltage application, and the viewability thereof was visually evaluated. As a result, no whiteness due to reflected light was observed on the light-emitting surface of the organic EL display device being obtained in Example and comprising the retardation film of the present invention, and an image thereon was clearly displayed. Hence, it was found that the organic EL display device obtained in Example 8 achieved an extremely high level of external light reflection prevention effect, and had a sufficiently excellent viewability. On the other hand, the light-emitting surface was blurred in white in the organic EL display device being obtained in Comparative Example 2 and using the commercially available optical film. Hence, it was found that the organic EL display device obtained in Comparative Example 2 was unable to sufficiently suppress reflection of external light on light-emitting surface, and had insufficient viewability.

Example 9

The circularly polarizing plate being obtained in Production Example 1 and comprising the retardation film of the present invention was pasted on a transparent substrate placed on a viewing side of a light-emitting surface of a commercially available liquid crystal display (LCD) cell with an acrylic-based sticky agent. Thus, a liquid crystal display device comprising the retardation film of the present invention was obtained.

Comparative Example 3

A liquid crystal display device for comparison was obtained in the same manner as in Example 9, except that a commercially available optical film (manufactured by Z eon Corporation under the product name of "ZEONOR Film") was used instead of the circularly polarizing plate obtained in Production Example 1.

[Characteristics Evaluation of Liquid Crystal Display Devices]

Each of the liquid crystal display devices obtained in Example 9 and Comparative Example 3 was caused to emit light, and the viewability thereof was visually evaluated. As a result, no whiteness due to reflected light was observed on the light-emitting surface in the liquid crystal display device being obtained in Example 9 and comprising the retardation film of the present invention, and an image thereon was clearly displayed. Hence, it was found that the liquid crystal display device obtained in Example 9 achieved an extremely high level of external light reflection prevention effect, and had a sufficiently excellent viewability. Note that a display portion was blurred in white in the liquid crystal display device being obtained in Comparative Example 3 and using the commercially available optical film. Hence, it was found that the liquid crystal display device obtained in Comparative Example 3 was unable to sufficiently suppress reflection of external light on the light-emitting surface, and had insufficient viewability.

From the results of characteristics evaluation of the organic EL display device and the liquid crystal display device, it was found that, when the retardation film of the present invention, which has reverse dispersion characteristics, was used as an anti-reflection film, an extremely high level of external light reflection prevention effect was obtained, and each device had a sufficiently excellent viewability.

INDUSTRIAL APPLICABILITY

As described above, according to the present invention, it is possible to provide a retardation film being capable of providing a reverse dispersion of birefringence wavelength dispersion characteristics, also of attaining optical characteristics as a negative A which are unique even among negative birefringence characteristics, and of exhibiting excellent optical characteristics and a high level of heat resistance, as well as to provide an organic EL display device and a liquid crystal display device using the retardation film. Accordingly, the retardation film of the present invention is particularly useful as a $\frac{1}{2}\lambda$ plate, a $\frac{1}{4}\lambda$ plate, a protection film, an anti-reflection film, and the like used for an organic EL display device, a liquid crystal display device, and the like.

The invention claimed is:

1. A retardation film, formed by stretching a film comprising a norbornene-based ring-opening copolymer containing a structural unit (A) represented by the following general formula (1):

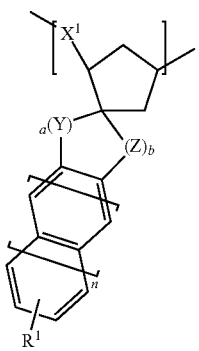
(1)

wherein in the formula (1),
n represents an integer of any one of 0 and 1,
$R^1$ represents an atom or a group selected from the group consisting of a hydrogen atom; halogen atoms; substituted or unsubstituted hydrocarbon groups, each of which may have at least one linking group selected from the group consisting of an oxygen atom, a nitrogen atom, a sulfur atom, and a silicon atom, and which has 1 to 30 carbon atoms; and polar groups,
$X^1$ represents a group selected from the group consisting of a group represented by a formula: —CH=CH— and a group represented by a formula:

—CH$_2$CH$_2$—, a and b each independently represent an integer of 0 to 6,
each Y, which may be the same or different when provided in plurality in a single structural unit, represents a group selected from the group consisting of a methylene group, a carbonyl group, an oxy group, and alkylimino groups having 1 to 5 carbon atoms, and
each Z, which may be the same or different when provided in plurality in a single structural unit, represents a group selected from the group consisting of a methylene group, a carbonyl group, an oxy group, and alkylimino groups having 1 to 5 carbon atoms, and
a structural unit (B) represented by the following general formula (2):

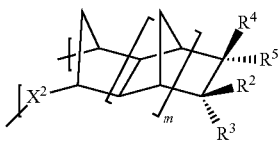
(2)

wherein in the formula (2),
m represents an integer of any one of 0 and 1,
$X^2$ represents a group selected from the group consisting of a group represented by a formula: —CH=CH— and a group represented by a formula:

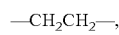
—CH$_2$CH$_2$—, $R^2$, $R^3$, $R^4$, and $R^5$, which may be the same or different, each represent an atom or a group selected from the group consisting of a hydrogen atom, halogen atoms, a cyano group, alkyl groups having 1 to 20 carbon atoms, alkenyl groups having 1 to 20 carbon atoms, alkylcarbonyl groups having 1 to 20 carbon atoms, and ester groups having a hydrocarbon group having 1 to 20 carbon atoms,
two or more of $R^2$ to $R^5$ may be bonded to each other to form a monocyclic hydrocarbon which has 3 to 20 carbon atoms, which is not a spiro ring, and which may have an unsaturated bond, or a polycyclic hydrocarbon which has 4 to 20 carbon atoms, which is not a spiro ring, and which may have an unsaturated bond, and
$R^2$ and $R^3$, or $R^4$ and $R^5$ may together form an alkylidene group having 1 to 20 carbon atoms, wherein
a content of the structural unit (A) is not less than 5 mol % but not more than 95 mol % relative to a total amount of the structural units (A) and (B),
wherein the content of the structural unit (A) is more than 50 mol % but not more than 95 mol % relative to the total amount of the structural units (A) and (B), and the retardation film is a negative A retardation film.

2. The retardation film according to claim 1, wherein, in the general formula (1), n is 0, and $R^1$ is a hydrogen atom.

3. The retardation film according to claim 1, wherein a total amount of a structural unit in which $X^1$ is the group represented by the formula: —CH$_2$CH$_2$— among the structural units (A) and a structural unit in which $X^2$ is the group represented by the formula: —CH$_2$CH$_2$— among the structural units (B) is 90 mol % or more relative to the total amount of the structural units (A) and (B) in the norbornene-based ring-opening copolymer.

4. The retardation film according to claim 1, wherein the norbornene-based ring-opening copolymer has a weight average molecular weight of 10000 to 1000000 in terms of polystyrene, and a molecular weight distribution of 1.0 to 10.

5. An organic EL display device comprising the retardation film according to claim 1.

6. A liquid crystal display device comprising the retardation film according to claim 1.

* * * * *